(12) United States Patent
Takagi

(10) Patent No.: US 6,777,718 B2
(45) Date of Patent: Aug. 17, 2004

(54) SEMICONDUCTOR OPTICAL DEVICE

(75) Inventor: Kazuhisa Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/357,375

(22) Filed: Feb. 4, 2003

(65) Prior Publication Data

US 2003/0160292 A1 Aug. 28, 2003

(30) Foreign Application Priority Data

Feb. 25, 2002 (JP) .................................. 2002-047662

(51) Int. Cl.[7] .................. H01L 33/00; H04R 5/00; H04R 25/00; H04H 5/00; G02B 26/00
(52) U.S. Cl. .................. 257/98; 381/1; 381/4; 381/131; 381/132; 359/248; 359/237; 359/243; 359/244; 359/240; 359/249; 359/279; 359/256; 372/50
(58) Field of Search ............. 257/98; 359/248, 359/237, 243, 244, 240, 249, 279, 256; 385/1, 4, 131, 132; 372/50

(56) References Cited

U.S. PATENT DOCUMENTS 5,771,257 A * 6/1998 Takiguchi et al. ............ 372/50
5,825,952 A * 10/1998 Kawanishi et al. ........... 385/47
5,970,081 A * 10/1999 Hirayama et al. ............ 372/96

FOREIGN PATENT DOCUMENTS

| JP | 9-171162 | 6/1997 |
| JP | 11-186661 | 7/1999 |

* cited by examiner

*Primary Examiner*—Eddie C. Lee
*Assistant Examiner*—Samuel A Gebremariam
(74) *Attorney, Agent, or Firm*—Leydig, Voit & Mayer, Ltd.

(57) ABSTRACT

A semiconductor optical device includes a substrate, an optical waveguide layer on the substrate and having well and barrier layers. The semiconductor optical device also includes an optical absorbing layer on the substrate and adjacent to the optical waveguide layer so that incident light having an incident wavelength $\lambda_{LD}$ is guided into the optical absorbing layer. Each of the well layers has a wavelength $\lambda g$ corresponding to the band gap of the well layers and that is larger than the incident wavelength $\lambda_{LD}$. Also, the band gap energy between base levels of a conduction band and a valence band of the optical waveguide layer is larger than the energy of the incident light having the incident wavelength $\lambda_{LD}$.

10 Claims, 4 Drawing Sheets

$$Eg = \frac{hc}{\lambda g}$$

$$EgMQW = \frac{hc}{\lambda gMQW}$$

$$\lambda gMQW < \lambda LD < \lambda g$$

$Eg = \dfrac{hc}{\lambda g}$ $\lambda g < \lambda LD$

SEMICONDUCTOR OPTICAL DEVICE

BACKGROUND OF THE INVENTION

1) Technical Field of the Invention

The present invention relates to a semiconductor optical device such as a semiconductor optical modulating device (semiconductor optical modulator) and a semiconductor optical detecting device (semiconductor optical detector), and in particular, to such a semiconductor optical device used for an optical communication system of 1.3 μm-band.

2) Description of Related Arts

FIG. 6 is a schematic perspective view of a conventional semiconductor light modulating device denoted by reference numeral 400. The semiconductor light modulating device 400 includes a substrate 1 of InP, having an upper portion formed in a ridge configuration. Provided on the ridge portion are a light absorbing layer 2 and a pair of optical waveguide layers 13, so that the light absorbing layer 2 is sandwiched by the pair of the optical waveguide layers 13. The light absorbing layer 2 may be formed as a bulk semiconductor layer or a multi-quantum-well layer (referred to as a "MQW layer") of material such as InGaAsP and InGaAlAs. On the other hand, the optical waveguide layer 13 is formed as a bulk semiconductor layer of InGaAsP. Successively deposited on the light absorbing layer 2 and the optical waveguide layers 13 are a cladding layer 4 of p-InP and a contact layer 5 of p-InGaAsP. Further, deposited on a top surface of the contact layer 5 and a bottom surface of the substrate 1 are an anode electrode 6 of Ti/Au and a cathode electrode 7, respectively.

In the semiconductor optical modulating device 400 of FIG. 6, an incident light 51, which is a continuous wave (referred to simply as "CW") of 1.3 μm-band, enters the optical waveguide layer 13, and is guided into the light absorbing layer 2.

A reverse biasing voltage is applied between the anode and cathode electrodes 6, 7 as a modulating electric signal of high frequency. The modulating electric signal causes the light absorbing layer 2 to absorb the CW light due to the Quantum Confined Stark effect or the Franz-Keldysh effect.

Thus, the outgoing light 52 from the other optical waveguide layer 13 has an amplitude and/or a phase modulated in the light absorbing layer 2.

FIG. 7 is an energy-band diagram of a region including and adjacent to the optical waveguide layer 13 in a cross section taken along the line VII—VII of FIG. 6, illustrating the band gap of the optical waveguide layer 13 formed as the bulk semiconductor layer between the substrate 1 and the cladding layer 4. The optical waveguide layer 13 has a composition ratio of InGaAsP selected so that it has a band gap energy corresponding to photon energy of light having a predetermined wavelength (referred to simply as a "wavelength λg "), which is 1.1 μm or shorter, for example. The wavelength λg (1.1 μm) of the optical waveguide layer 13 is shorter than the wavelength of the CW light (1.3 μm) so as to reduce absorption of the CW light within the optical waveguide layer 13.

However, when the optical waveguide layer 13 of InGaAsP has a wavelength λg of 1.1 μm, it has a refractive index of approximately 3.30. Meanwhile, the substrate 1 of InP and the cladding layer 4 of InP have refractive indices of approximately 3.21. Thus, there exists a small difference (0.09) of the refractive indices between the substrate 1 and the cladding layer 4, and the optical waveguide layer 13.

In order to confine the incident CW light in the optical waveguide layer 13 in an efficient manner as realized by a commercially available semiconductor modulating device of 1.55 μm-band, the difference of the refractive indices therebetween should be 0.15 or more.

Although the longer wavelength λg of the optical waveguide layer 13 can improve the efficiency of the optical confinement, it disadvantageously causes the optical waveguide layer 13 to absorb the incident light more.

SUMMARY OF THE INVENTION

Therefore, one of the embodiments of the present invention is to provide a semiconductor optical device, in which the light of 1.3 μm-band is less absorbed and confined in a more efficient manner in the optical waveguide layer.

One of the embodiments of the present invention has an object to provide a semiconductor optical device including a substrate, an optical waveguide layer formed on the substrate as a multi-quantum-well layer having well and barrier layers. The semiconductor optical device also includes a light absorbing layer formed on the substrate and adjacent to the optical waveguide layer so that an incident light having an incident wavelength $\lambda_{LD}$ through the optical waveguide layer is guided into the light absorbing layer. It also has a cladding layer formed both on the optical waveguide layer and the light absorbing layer, and a pair of electrodes formed so as to sandwich the optical absorbing layer. Each of the well layers has a wavelength λg longer than the incident wavelength $\lambda_{LD}$. Also, an effective transition energy gap between the lowest energy levels of a conduction band and a valence band of the optical waveguide layer is larger than a photon energy of the incident light.

Further scope of applicability of the present invention will become apparent from the detailed description given hereinafter. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention more fully be understood from the detailed description given hereinafter and accompanying drawings which are given by way of illustration only, and thus are not limitative of the present invention and wherein.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "top", "bottom", and "upper") are conveniently used just for clarity, it should not be interpreted that those terminology limit the scope of the present invention.

Embodiment 1

Figure 1:
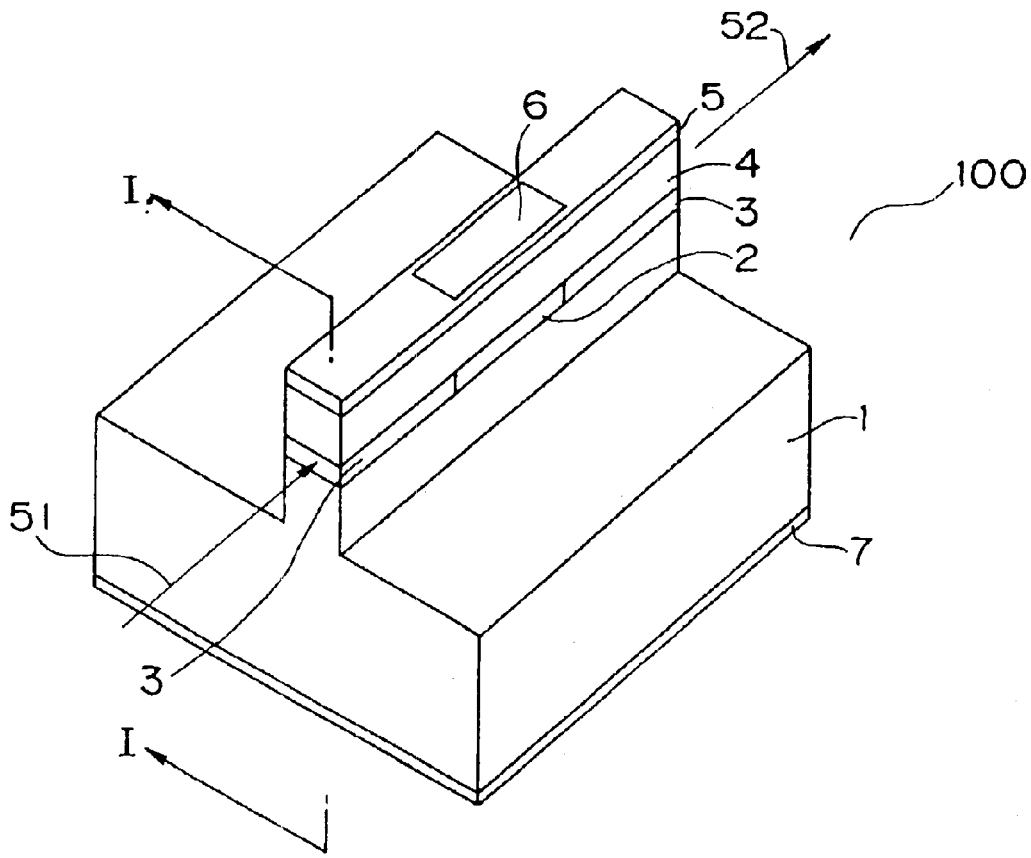
FIG. 1 is a schematic perspective view of a semiconductor optical device according to Embodiment 1 of the present invention.

Referring to FIGS. 1 to 4, as one example of a semiconductor optical device according to Embodiment 1 of the present invention, a semiconductor optical modulating device will be described hereinafter. FIG. 1 is a schematic perspective view of the semiconductor optical modulating device denoted by reference numeral 100, which is used for modulating light of 1.3 µm-band.

The semiconductor optical modulating device 100 includes a substrate 1 of InP, having an upper portion formed in a ridge configuration. Provided on the ridge portion of the substrate 1 are a light absorbing layer 2 and a pair of optical waveguide layers 3, so that the light absorbing layer 2 is sandwiched by the pair of the optical waveguide layers 3. The light absorbing layer 2 may be formed as a bulk semiconductor layer or a multi-quantum-well layer (referred to as a "MQW layer") of material such as InGaAsP and InGaAlAs. Successively deposited on the light absorbing layer 2 and the optical waveguide layers 3 are a cladding layer 4 of p-InP and a contact layer 5 of p-InGaAsP. Further, deposited on a top surface of the contact layer 5 and a bottom surface of the substrate 1 are an anode electrode 6 of Ti/Au and a cathode electrode 7, respectively.

Figure 2:
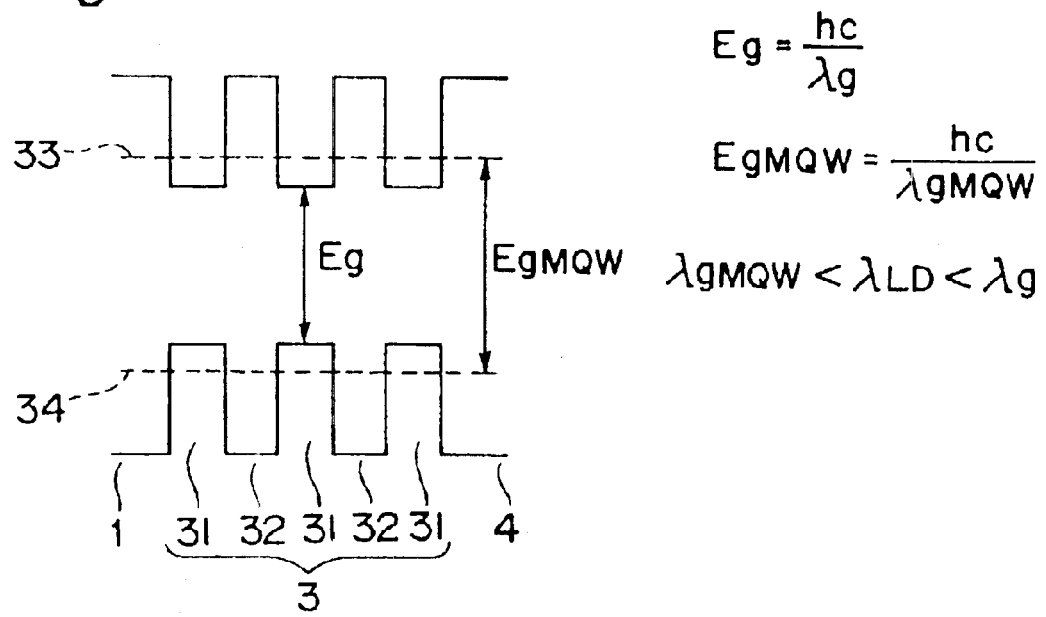
FIG. 2 is a band-energy diagram of a waveguide layer of the semiconductor optical device according to Embodiment 1.

According to the semiconductor optical modulating device 100 of the present embodiment, each of the optical waveguide layers 3 is formed as a MQW layer. FIG. 2 is an energy-band diagram of a region including and adjacent to the optical waveguide layer 3 in a cross section taken along the line I—I of FIG. 1.

Material composing the optical waveguide layer 3 is selected so as to confine an incident light in the optical waveguide layer 3 effectively. In particular, the optical waveguide layer 3 is designed to include layers 31 of InGaAsP and barrier layers 32 of InP, which are formed alternately. The refractive index of InGaAsP can be controlled to 3.53 or more by adjusting the composition (composition ratio) thereof. Thus, in case where each of the well layers 31 and barrier layers 32 have thicknesses of approximately 6 nm, the effective refractive index of the optical waveguide layer 3 can be set to 3.37 or more. Meanwhile, the substrate 1 of InP and the cladding layer 4 of InP sandwiching the optical waveguide layer 3 have the refractive indices of 3.21.

Therefore, the optical waveguide layer 3 can be designed to have the effective refractive index greater than those of the InP layers 1, 4 by the difference of 0.16 or more so as to achieve an improved efficiency in confining the light therein.

However, the well layer 31 of InGaAsP of which refractive index is controlled to 3.53 or more has the wavelength $\lambda g$ that is longer than the wavelength $\lambda_{LD}$ (=1.3 µm) of the incident light to be modulated in the semiconductor light modulating device 100 (referred to simply as "$\lambda_{LD}$"). To this end, the light is absorbed by the well layer 31 of the optical waveguide layer 3.

In FIG. 2, the lowest energy levels of a conduction band and a valence band of the optical waveguide layer 3 are indicated by a pair of imaginary lines 33, 34, respectively. Also, a band gap energy $Eg_{MQW}$ of the optical waveguide layer 3 is defined between the base levels 33, 34, which can be adjusted by controlling the thicknesses of the well layer 31 and the barrier layer 32.

Therefore, $Eg_{MQW}$ of the optical waveguide layer 3 can be controlled greater than that a photon energy ($Eg_{LD}=hc/\lambda_{LD}$) of the incident light so that the light absorption in the optical waveguide layer 3 is prevented. In other words, the thickness of the well layer 31 can be appropriately adjusted so that the light absorption in the optical waveguide layer 3 is prevented. To this result, the incident light of $\lambda_{LD}$ (=1.3 µm) to be guided through the optical waveguide layer 3 is well confined and not absorbed in the optical waveguide layer 3.

Also, although needless to mention, the barrier layer 32 has the band gap energy which is transparent for the incident wavelength $\lambda_{LD}$.

Next, referring to FIG. 3, the details will be described with respect to the thicknesses of the well layer 31 and the barrier layer 32 composing the optical waveguide layer 3.

Figure 3:
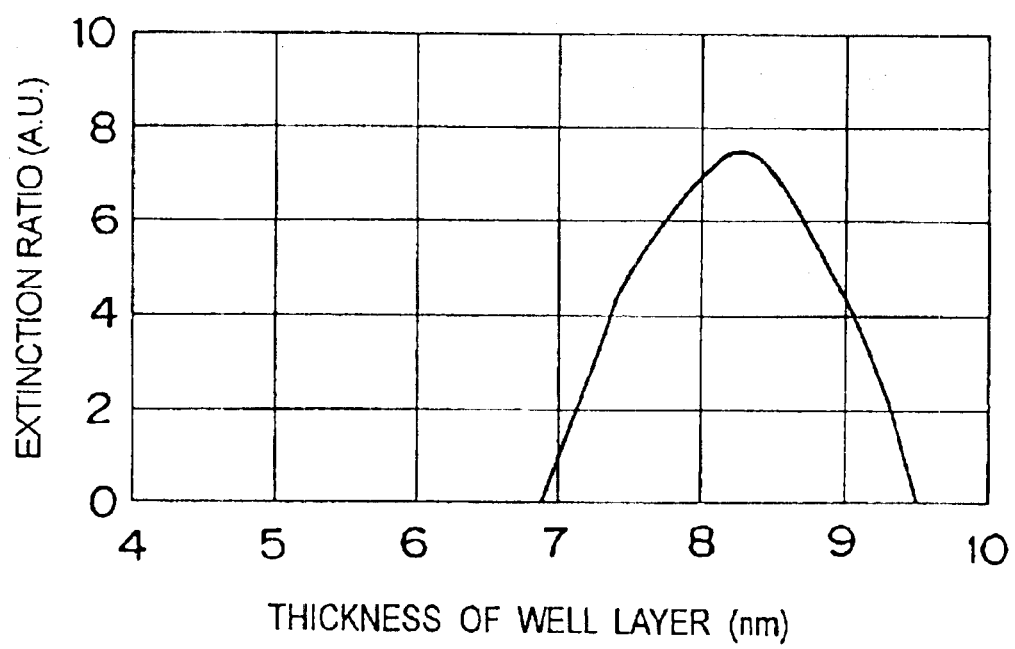
FIG. 3 is a graph illustrating a light modulating amplitude varying in accordance with thickness of the well layer.

FIG. 3 is a graph illustrating an extinction ratio varying in accordance with the thickness of the well layer 3, when a voltage is applied to the semiconductor light modulating device 100 including the optical waveguide layer 3 formed as a MQW layer having a plurality of well layers 31 of InGaAsP and barrier layers 32 of InP. The incident light 51 to be modulated has the incident wavelength $\lambda_{LD}$ of 1.3 µm, and the voltage applied between the anode and cathode electrodes 6, 7 is 0–3 Volts to modulate the incident light.

As clearly shown in FIG. 3, the light is modulated when the thickness of the well layer 31 falls within the range of about 6.8 nm to 9.5 nm, and the extinction ratio is maximum at the thickness of about 8.3 nm. It is understood that the Optical Confined Stark effect is efficiently appeared for the thickness defined in the above range.

When the voltage is applied between the anode and cathode electrodes 6, 7 of the semiconductor optical modulating device 100, each of the optical waveguide layers 3 has a portion adjacent to the light absorbing layer 2, to which the voltage is also applied. The light absorbing layer 2 is formed as a MQW layer, the light is absorbed by the portions of the optical waveguide layers 3 due to the Quantum Confined Stark effect. This optical absorption makes a noise so that the quality and/or reliability of the modulated signal of the semiconductor light modulating device 100 are deteriorated.

According to the semiconductor optical modulating device 100 of the present embodiment, each of the well layers 31 of the optical waveguide layers 3 has the thickness of 6 nm or less in order to eliminate the deterioration of the modulated signal.

Also, it should be noted that the thickness of the well layer 31 is set to be 3 nm or more so that the light is effectively confined in the optical waveguide layer 3.

Meanwhile, when the barrier layer 32 is too thin, the well layers 31 sandwiching the barrier layer 32 have wave functions of electrons, which are coupled to each other. Then, the base energy level of the well layers 31 is lower than that where each well layer 31 is isolated sufficiently by the thick barrier layer 32. In other words, when the band gap energy of the optical waveguide layer 3 is less, the light of 1.3 µm is absorbed thereby more.

In particular, it is well known that when the barrier layer 32 is thinner than approximately 5 µm, the light absorption by the optical waveguide layer 3 is increased. Thus, the thickness of the barrier layer 32 should be approximately 5 µm or more.

As above, since each well layer 31 is set to have the thickness of 6 µm or less, if each barrier layer 32 has the thickness of 6 µm or more, then the optical waveguide layer 3 including the well layers 31 and the barrier layers 32 would have the effective refractive index lower, so that the optical confinement efficiency is reduced. Therefore, the thickness of the barrier layer 32 is preferably set to approximately 6 μm or less.

Next, the operation of the semiconductor light modulating device 100 will be described hereinafter. The incident light 51 having the wavelength of 1.3 μm-band (about 1.2 μm to 1.4 μm) enters the optical waveguide layer 3, and in turn is guided through the light absorbing layer 2.

The reverse biasing voltage of 0–3 Volts is applied between the anode and cathode electrodes 6, 7, which is in response to the modulating electric signal of high frequency. To this result, the modulating electric signal causes the light absorbing layer 2 to absorb the light guided through the light absorbing layer 2 due to the Quantum Confined Stark effect or the Franz-Keldysh effect.

Thus, the amplitude and/or the phase of the light 52 outgoing from the other optical waveguide layer 3 are modulated.

Each of the optical waveguide layers 3 is formed as the MWQ layer of material described above, so that the light absorption by the optical waveguide layer 3 can be prevented and the optical confinement can be realized effectively.

Also, each of the well layers 31 and the barrier layers 32 are designed to have the predetermined thicknesses so that the noise generated in the optical waveguide layer 3 can be eliminated while applying the modulating electric signals.

In the above description, although the substrate 1 is made of InP and the well and barrier layers 31, 32 of the optical waveguide layer 3 are made of InGaAsP and InP, respectively, they are not limited thereto, they can be made other materials described in the following table (Table 1).

TABLE 1

| No. | substrate | Material for Well Layer (composition ratio for satisfying $\lambda g > \lambda_{LD}$) | Material for Barrier Layer (composition ratio for satisfying $\lambda g < \lambda_{LD}$) |
| --- | --- | --- | --- |
| 1 | InP | InGaAlAs | InP |
| 2 | InP | InGaAlP | InGaP |
| 3 | InP | InGaAlAs | InGaP |
| 4 | InP | InGaAlAsSb | InP |
| 5 | InP | InGaAlAsSb | InGaP |
| 6 | InP | InGaAsP | InGaAsP |
| 7 | TnP | InGaAlAs | InGaAlAs |
| 8 | InP | InGaAsP | InGaAlAs |
| 9 | InP | InGaAlAs | InGaAsP |
| 10 | GaAs | InGaNAs | GaAlAs |
| 11 | GaAs | InGaNAs | GaAs |
| 12 | GaAs | InGaAs | GaAs |

Further, materials indicated in Table 1 can be used for an optical waveguide layer of a Mach-Zender type semiconductor light modulating device 200 according to Embodiments 2 and a Waveguide type semiconductor light receiving devices 300 according to Embodiments 3, as will be described hereinafter.

Embodiment 2

Figure 4:
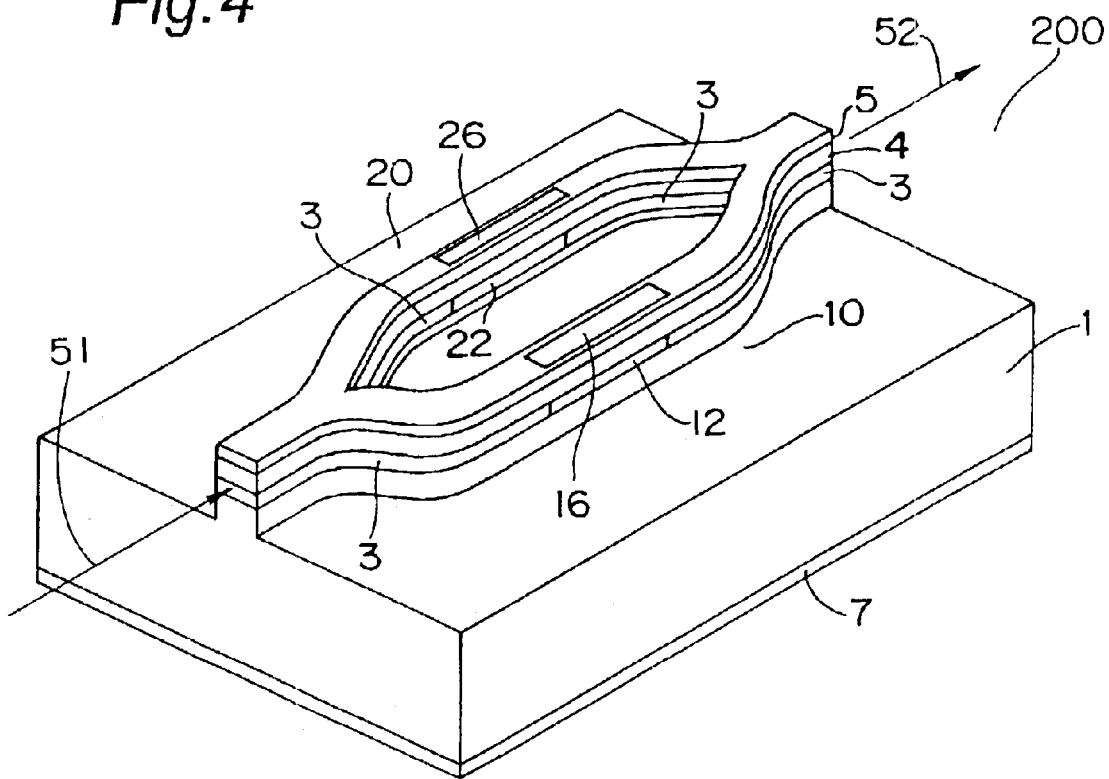
FIG. 4 is a schematic perspective view of a Mach-Zender semiconductor optical modulating device according to Embodiment 2 of the present invention.

FIG. 4 is a schematic perspective view of a Mach-Zender type semiconductor light modulating device denoted by reference numeral 200. Similar or the same components in FIG. 4 are denoted as similar or the same reference numerals indicated in FIG. 1.

Similar to the semiconductor light modulating device 100 according to Embodiment 1, the semiconductor light modulating device 200 according to Embodiment 2 includes a substrate 1 of InP, including an upper ridge portion having a pair of branching members which are branched and merged again. Provided on each of the branching members of the ridge portion are a first and second waveguide members 10, 20, including a pair of light absorbing layers 12, 22, each of which is sandwiched by a pair of light waveguide layers 3. The light absorbing layers 12, 22 and the optical waveguide layers 3 are made of materials as described above. Also, each of the first and second waveguide members 10, 20 includes a cladding layer 4, a contact layer 5, an anode electrode 6, and a cathode electrode 7, as similar to that of Embodiment 1.

The incident light 51 of 1.3 μm-band enters the semiconductor light modulating device 200 and is branched and guided into the optical waveguide layers 3 of the first and second waveguide members 10, 20. Then, the branched lights are merged again to the light 52 outgoing from the other optical waveguide layer 13. The optical paths running through the optical waveguide layers 3 of the first and second waveguide members 10, 20 are designed to be substantially the same.

According to the Mach-Zender type semiconductor light modulating device 200, a pair of reverse biasing voltages different from each other are applied between the anode electrode 16 of the first waveguide members 10 and the cathode electrode 7, and between the anode electrode 26 of the second waveguide members 20 and the cathode electrode 7. Thus, the light through the optical absorbing layers 12, 22 are modulated independently by the separate biasing voltages. Eventually, the independently modulated lights interfere each other when combined. Thus, in the Mach-Zender type semiconductor light modulating device, the amplitude of the incident light 51 can be modulated to obtain the outgoing light 52 by applying different voltages to the anode electrodes 16, 26.

The optical waveguide layer 3 as described in Embodiment 1 can be used in the Mach-Zender type semiconductor light modulating device 200 of the present embodiment so that the light absorption can be prevented and the optical confinement efficiency can be improved in the optical waveguide layer 3.

Also, when the electric modulating signals are applied to the anode electrodes 16, 26, the noises generated by the optical waveguide layers 3 can be eliminated.

Therefore, the Mach-Zender type semiconductor light modulating device 200 having a reduced optical loss and an improved modulation efficiency can be realized according to the present embodiment.

Embodiment 3

Figure 5:
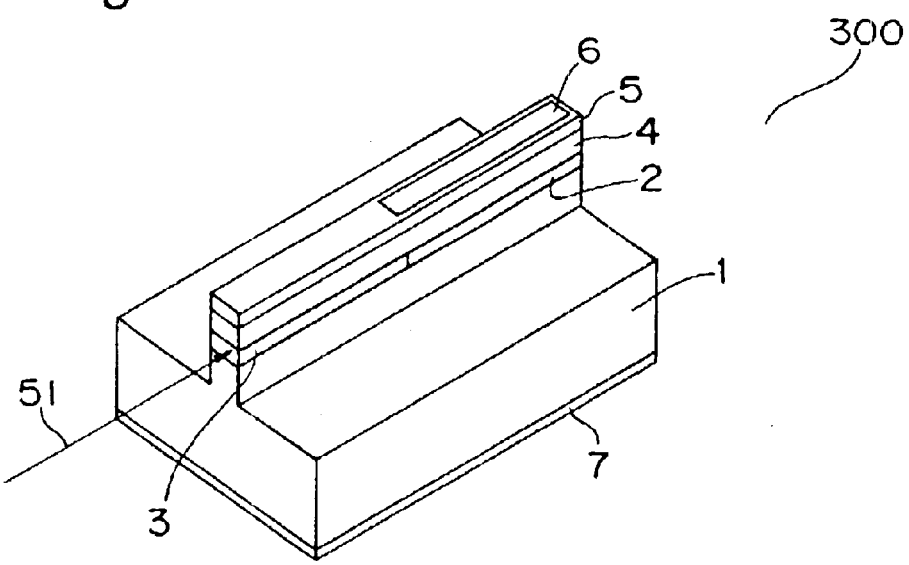
FIG. 5 is a schematic perspective view of a semiconductor waveguide photodetector according to Embodiment 3 of the present invention.
Figure 6:
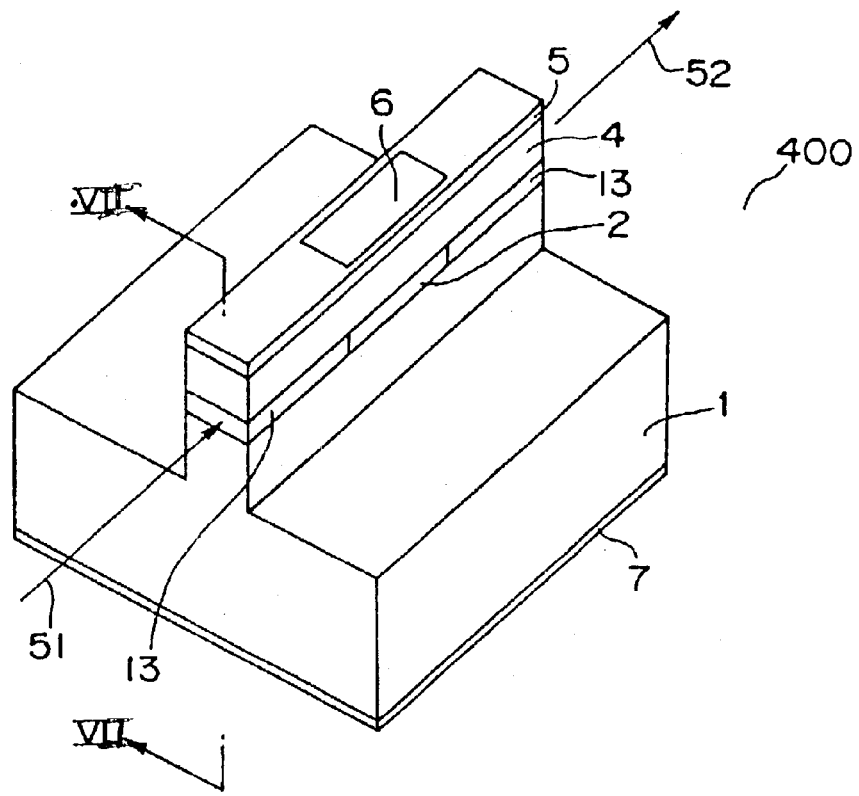
FIG. 6 is a schematic perspective view of a conventional semiconductor optical device.
Figure 7:
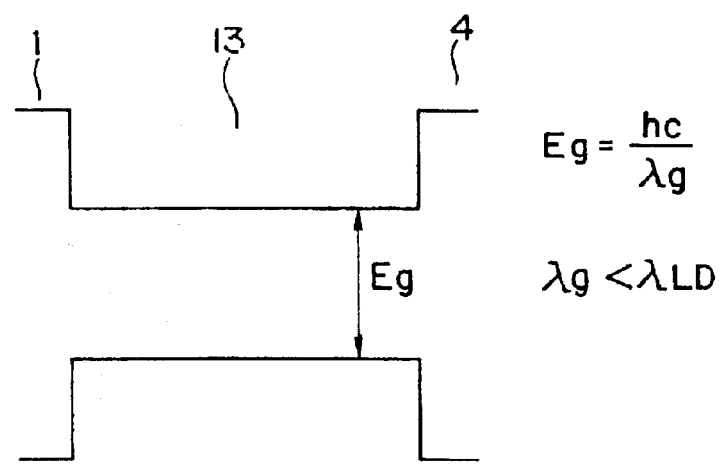
FIG. 7 is a band-energy diagram of a waveguide layer of the conventional semiconductor optical device.

Referring to FIG. 5, as an another example of a semiconductor optical device according to Embodiment 3 of the present invention, a Waveguide type semiconductor light receiving device will be described hereinafter. FIG. 5 is a schematic perspective view of the Waveguide type semiconductor light receiving device denoted by reference numeral 300. Similar or the same components in FIG. 5 are denoted as similar or the same reference numerals indicated in FIG. 1.

The Waveguide type semiconductor light receiving device 300 of Embodiment 3 has a structure similar to that of Embodiment 1 except that the optical waveguide layer 3 is provided on only one side (incident side) of the light absorbing layer 2, instead of on both sides thereof as clearly shown in FIGS. 1 and 5.

In the Waveguide type semiconductor light receiving device 300, the incident light 51 comes in the optical waveguide layer 3 and is guided into the optical absorbing layer 2, in which the modulated light is absorbed to generate a pair of a electron and hole. Thus, the Waveguide type semiconductor light receiving device converts the incident modulated light 51 to a current or electric signals in the optical absorbing layer 2 varying in response to the varying amplitude of the incident light 51. It should also be noted that the incident light used for the Waveguide type semiconductor light receiving device is of 1.3 μm-band.

The optical waveguide layer 3 as described in Embodiment 1 can be used in the Waveguide type semiconductor light receiving device 300 of the present embodiment so that the light absorption can be prevented and the light confinement effect can be improved in the optical waveguide layer 3.

Therefore, the semiconductor light modulating device 300 having a reduced optical loss can be realized according to the present embodiment.

As well illustrated in the aforementioned description, the semiconductor optical device having the optical waveguide layer 3 formed as the MQW layer can reduce its optical loss, and achieve a high modulating efficiency and a high detecting efficiency according to the present invention.

What is claimed is:

1. A semiconductor optical modulator comprising:
    a substrate;
    an optical waveguide layer on said substrate including a multi-quantum-well structure having a plurality of well and barrier layers, for receiving and guiding incident light;
    an optical absorbing layer on said substrate and adjacent to said optical waveguide layer, so that the incident light incident on and guided by said optical waveguide and having a wavelength $\lambda_{LD}$ is guided into said optical absorbing layer;
    a cladding layer located on both said optical waveguide layer and said optical absorbing layer; and
    a pair of electrodes sandwiching said optical absorbing layer, wherein, in the multi-quantum well structure of said optical waveguide layer,
        each of said well layers has a band gap energy and a wavelength $\lambda g$, corresponding to the band gap energy of said well layers, the wavelength $\lambda g$ being longer than the wavelength $\lambda_{LD}$, and
        band gap energy of the multi-quantum-well structure of said optical waveguide layer is larger than the energy of the incident light having the wavelength $\lambda_{LD}$.

2. The semiconductor optical modulator according to claim 1, wherein said well and barrier layers have thicknesses controlled so that the difference between an effective refractive index of said optical waveguide layer and a cladding refractive index of said cladding layer is about 0.15 or more.

3. The semiconductor optical modulator according to claim 1, wherein the wavelength $\lambda_{LD}$ falls within a range from about 1.2 μm to 1.4 μm.

4. The semiconductor optical modulator according to claim 1, wherein said substrate and said cladding layer are InP.

5. The semiconductor optical modulator according to claim 1, wherein each of said well layers has a thickness of about 6 nm, and each of said barrier layers has a thickness in a range from about 5 nm to 6 nm.

6. The semiconductor optical modulator according to claim 1, wherein said well and barrier layers of said optical waveguide layer are selected, in combination, from the group consisting of InGaAlAs/InP, InGaAsP/InGaP, InGaAlAs/InGaP, InGaAlAsSb/InP, InGaAlAsSb/InGaP, InGaAsP/InGaAsP, InGaAlAs/InGaAlAS, InGaAsP/InGaAlAs, and InGaAlAs/InGaAsP.

7. The semiconductor optical modulator according to claim 1, wherein said substrate is GaAs, and said well and barrier layers of said optical waveguide layer are selected, in combination, from the group consisting of InGaNAs/GaAlAs, InGaNAs/GaAs, and InGaAs/GaAs.

8. The semiconductor optical modulator according to claim 1, wherein the incident light guided into said optical absorbing layer is modulated in response to a voltage applied between said pair of electrodes.

9. The semiconductor optical modulator according to claim 1, including a second optical waveguide layer on said substrate, including a multi-quantum-well structure having a plurality of well and barrier layers, adjacent said optical absorbing layer so that the incident light incident on said optical waveguide is guided into said optical absorbing layer through said optical waveguide layer and is guided from said optical absorbing layer through said second optical waveguide layer.

10. A semiconductor light detector comprising:
    a substrate;
    an optical waveguide layer on said substrate, including a multi-quantum-well structure having a plurality of well and barrier layers, for receiving and guiding incident light;
    an optical absorbing layer on said substrate and adjacent to said optical waveguide layer, so that the incident light incident on and guided by said optical waveguide and having a wavelength $\lambda^{LD}$ is guided into said optical absorbing layer;
    a cladding layer located on both said optical waveguide layer and said optical absorbing layer; and
    a pair of electrodes sandwiching said optical absorbing layer, wherein, in the multi-quantum well structure of said optical waveguide layer,
        each of said well layers has a band gap energy and a wavelength $\lambda_{LD}$, corresponding to the band gap energy of said well layers, the wavelength $\lambda g$ being longer than the wavelength $\lambda_{LD}$, and
        band gap energy of the multi-quantum-well structure of said optical waveguide layer is larger than the energy of the incident light having the wavelength $\lambda_{LD}$,
    wherein the incident light guided into said optical absorbing layer is converted in said optical absorbing layer to a current detectable through said pair of electrodes.

* * * * *